US007576556B1

(12) United States Patent
Huang et al.

(10) Patent No.: US 7,576,556 B1
(45) Date of Patent: Aug. 18, 2009

(54) LIQUID CRYSTAL DISPLAY DEVICE HAVING TEST ARCHITECTURE AND RELATED TEST METHOD

(75) Inventors: Wei-Kai Huang, Hsin-Chu (TW); Chin-Lun Lee, Hsin-Chu (TW); Chia-Chiang Lin, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 12/203,148

(22) Filed: Sep. 3, 2008

(30) Foreign Application Priority Data

Jun. 24, 2008 (TW) .............................. 97123499 A

(51) Int. Cl.
*G01R 31/00* (2006.01)

(52) U.S. Cl. ...................................................... 324/770

(58) Field of Classification Search .............. 324/158.1, 324/527, 765–770; 349/40, 54, 192; 345/99
See application file for complete search history.

(56) References Cited

U.S. PATENT DOCUMENTS

| | | | | |
|---|---|---|---|---|
| 6,566,902 | B2 * | 5/2003 | Kwon et al. | 324/770 |
| 6,999,153 | B2 | 2/2006 | Choi | |
| 7,129,923 | B2 * | 10/2006 | Lu | 345/92 |
| 2006/0208985 | A1 | 9/2006 | Hwang | |

* cited by examiner

*Primary Examiner*—Ha Tran T Nguyen
*Assistant Examiner*—Trung Q Nguyen
(74) *Attorney, Agent, or Firm*—Winston Hsu

(57) ABSTRACT

An LCD device having test architecture includes a plurality of data lines, a plurality of gate lines, a plurality of common lines, and a plurality of rows of pixel units. The odd and even common lines are utilized for furnishing a first common voltage and a second common voltage, respectively. The odd and even rows of pixel units are coupled to corresponding odd and even common lines, respectively. Furthermore, disclosed is a test method for detecting defects of the LCD device. The test method includes enabling all the gate lines and furnishing a first test voltage to a corresponding data line during a first interval, disabling even gate lines and furnishing a second test voltage to the corresponding data line during a second interval, and switching the second common voltage from a first common test voltage to a second common test voltage during a third interval.

20 Claims, 8 Drawing Sheets

| | |
|---|---|
| $V_{p12}$ ($V_1$) | $V_{p11}$ ($V_2$) |
| $V_{p22}$ ($V_3$) | $V_{p21}$ ($V_3$) |
| $V_{p32}$ ($V_1$) | $V_{p31}$ ($V_2$) |
| $V_{p42}$ ($V_3$) | $V_{p41}$ ($V_3$) |

FIG. 4

| | |
|---|---|
| $V_{p12}$ ($V_1$) | $V_{p11}$ ($V_1$) |
| $V_{p22}$ ($V_3$) | $V_{p21}$ ($V_4$) |
| $V_{p32}$ ($V_1$) | $V_{p31}$ ($V_1$) |
| $V_{p42}$ ($V_3$) | $V_{p41}$ ($V_4$) |

FIG. 7

LIQUID CRYSTAL DISPLAY DEVICE HAVING TEST ARCHITECTURE AND RELATED TEST METHOD

BACKGROUND OF THE INVENTION

1. Field of the Invention

The present invention relates to a liquid crystal display device having test architecture and related test method, and more particularly, to a liquid crystal display device having test architecture for performing an accurate defect detection operation and related test method.

2. Description of the Prior Art

Because liquid crystal display (LCD) devices are characterized by thin appearance, low power consumption, and low radiation, LCD devices have been widely applied in various electronic products for panel displaying. In general, the LCD device comprises liquid crystal cells encapsulated by two substrates and a backlight module for providing a light source. The operation of an LCD device is featured by varying voltage drops between opposite sides of the liquid crystal cells for twisting the angles of the liquid crystal molecules of the liquid crystal cells so that the transparency of the liquid crystal cells can be controlled for illustrating images with the aid of the backlight module.

Along with the demand of high display resolution on the LCD device, the elements integrated in the LCD device have been sized down for achieving high integrity, and therefore any tiny defect or particle contamination may degrade display quality significantly. That is, the production line for fabricating LCD devices having high display resolution is getting hard to achieve high yields. Accordingly, in the fabrication of the LCD devices, the defect detection operation is an important process for ensuring high product quality. Also, the defect detection operation can be utilized to get rid of the flawed semi-finished products in a real time for saving production cost. Furthermore, by making an analysis on the results of the defect detection operation, the cause of the defects can be analyzed for providing valuable information regarding systematic problems with the fabrication process, especially while bringing up a new fabrication process. In other words, the defect detection operation on semi-finished products can be applied to improve the health of the fabrication process.

It is well known that each pixel unit of an LCD device can be designed to include two sub-pixel units for achieving a wide viewing angle. That is, based on gray level averaging effect of two Gamma curves corresponding to the two sub-pixel units, optimal visual experience can be realized in different viewing angles for having a high-quality wide viewing angle. In general, the short-circuit defect of the LCD device occurs between adjacent sub-pixel units, and therefore the defect detection operation for detecting the short-circuit defect between adjacent sub-pixel units is critical to the process control of the production line for fabricating LCD devices. However, in the prior-art defect detection operation for detecting the short-circuit defects between adjacent sub-pixel units, only parts of the short-circuit defects can be detected. Consequently, not all the flawed semi-finished products can be thrown away in a real time for saving production cost, and the results of the prior-art defect detection operation cannot provide enough information for improving the health of the fabrication process so as to achieve high yields.

SUMMARY OF THE INVENTION

In accordance with an embodiment of the present invention, a liquid crystal display device having test architecture for performing an accurate defect detection operation is disclosed. The liquid crystal display device comprises a plurality of data lines, a plurality of gate lines, a plurality of common lines, and a plurality of rows of pixel units.

Each of the data lines is adapted to receive a corresponding data signal. Each of the gate lines is adapted to receive a corresponding gate signal. The common lines comprise a plurality of odd common lines and a plurality of even common lines. The odd common lines are adapted for receiving a first common voltage. The even common lines are adapted for receiving a second common voltage. Each row of pixel units comprises a plurality of pixel units. A plurality of pixel units of an odd row of pixel units in the rows of pixel units are coupled to a corresponding odd common line of the common lines, and a plurality of pixel units of an even row of pixel units in the rows of pixel units are coupled to a corresponding even common line of the common lines.

The present invention further discloses a test method for testing an LCD device. The LCD device comprises a plurality of first gate lines, a plurality of second gate lines, a plurality of data lines, a plurality of first common lines and a plurality of second common lines.

The test method comprises: furnishing a gate enable signal to the first gate lines and the second gate lines, furnishing a first test voltage to a data line of the data lines, furnishing a first common test voltage to the first common lines, furnishing a second common test voltage to the second common lines during a first interval; furnishing the gate enable signal to the first gate lines, furnishing a gate disable signal to the second gate lines, furnishing a second test voltage to the data line, furnishing the first common test voltage to the first common lines, furnishing the second common test voltage to the second common lines during a second interval; and furnishing the gate disable signal to the first gate lines and the second gate lines, furnishing a third common test voltage to the second common lines during a third interval.

These and other objectives of the present invention will no doubt become apparent to those of ordinary skill in the art after reading the following detailed description of the preferred embodiment that is illustrated in the various figures and drawings.

BRIEF DESCRIPTION OF THE DRAWINGS

FIG. 4 is a table schematically showing the sub-pixel voltages of the flawless LCD device in FIG. 1 after performing the first test method based on the related signal waveforms in FIG. 2.

FIG. 7 is a table schematically showing the sub-pixel voltages of the flawless LCD device in FIG. 1 after performing the second test method based on the related signal waveforms in FIG. 5.

DETAILED DESCRIPTION

Hereinafter, preferred embodiments of the present invention will be described in detail with reference to the accompanying drawings. Here, it is to be noted that the present invention is not limited thereto. Furthermore, the step serial numbers regarding the test method are not meant thereto limit the operating sequence, and any rearrangement of the operating sequence for achieving same functionality is still within the spirit and scope of the invention.

Figure 1:
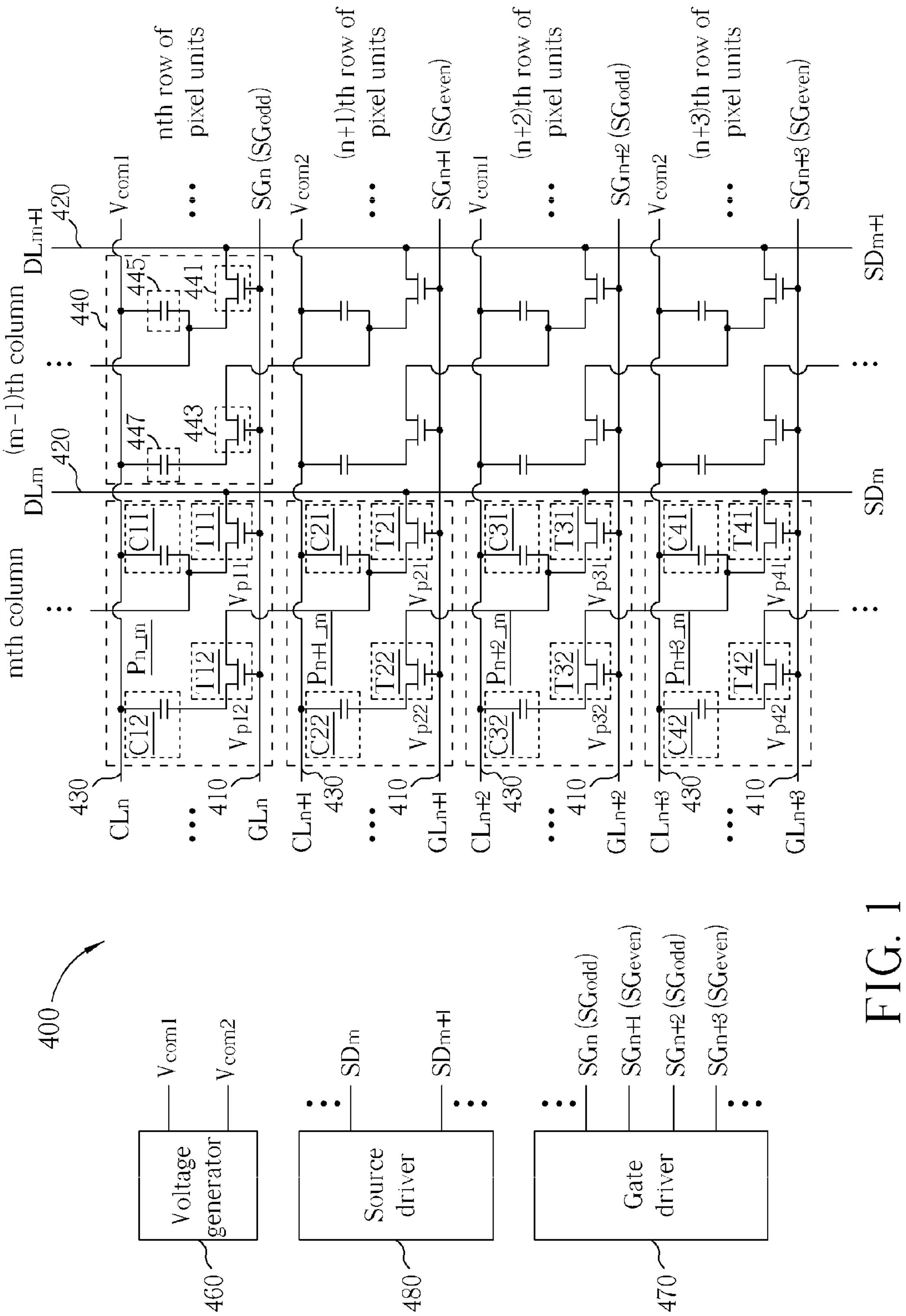
FIG. 1 is a schematic diagram showing an LCD device in accordance with a first embodiment of the present invention.

FIG. 1 is a schematic diagram showing an LCD device in accordance with a first embodiment of the present invention. As shown in FIG. 1, the LCD device 400 comprises a plurality of gate lines 410, a plurality of data lines 420, a plurality of common lines 430, a plurality of rows of pixel units, a voltage generator 460, a gate driver 470 and a source driver 480. Each row of pixel units comprises a plurality of pixel units 440. Each pixel unit 440 comprises a first switch 441, a second switch 443, a first pixel capacitor 445, and a second pixel capacitor 447. The combination of the first switch 441 and the first pixel capacitor 445 forms a sub-pixel unit, and the combination of the second switch 443 and the second pixel capacitor 447 forms another sub-pixel unit. The first switch 441 and the second switch 443 can be metal-oxide-semiconductor (MOS) field effect transistors or thin film transistors.

Each first pixel capacitor 445 comprises a first end and a second end. The first end of each first pixel capacitor 445 is coupled to one corresponding common line 430. Each second pixel capacitor 447 comprises a first end and a second end. The first end of each second pixel capacitor 447 is coupled to one corresponding common line 430. Each first switch 441 comprises a first end coupled to the second end of one corresponding first pixel capacitor 445, a second end coupled to one corresponding data line 420, and a gate coupled to one corresponding gate line 410. Each second switch 443 comprises a first end coupled to the second end of one corresponding second pixel capacitor 447, a second end coupled to the first end of the first switch 441 in one different pixel unit 440, and a gate coupled to one corresponding gate line 410. The pixel units 440 in each odd row of pixel units are coupled to one corresponding odd common line 430 for receiving a first common voltage Vcom1. The pixel units 440 in each even row of pixel units are coupled to one corresponding even common line 430 for receiving a second common voltage Vcom2. In another embodiment, the odd and even common lines 430 are utilized for receiving the second common voltage Vcom2 and the first common voltage Vcom1 respectively so that the second common voltage Vcom2 and the first common voltage Vcom1 are applied to the pixel units 440 in odd and even rows of pixel units respectively.

For instance, in the mth pixel unit Pn_m of the nth row of pixel units (odd row of pixel units), the first ends of the first pixel capacitor C11 and the second pixel capacitor C12 are both coupled to the common line CLn. The numbers n and m are integers greater than zero. The gates of the first switch T11 and the second switch T12 are both coupled to the gate line GLn. The first end of the first switch T11 is coupled to the second end of the first pixel capacitor C11. The first end of the second switch T12 is coupled to the second end of the second pixel capacitor C12. The second end of the first switch T11 is coupled to the data line DLm. The second end of the second switch T12 is coupled to the first end of the first switch T21 in the mth pixel unit Pn+1_m of the (n+1)th row of pixel units. The second end of the first switch T21 is coupled to the data line DLm. That is, both the second ends of the first switch T11 and the first switch T21 are coupled to the data line DLm, and both the first pixel capacitor C11 and the second pixel capacitor C12 are charged by the data signal SDm furnished via the data line DLm.

In the mth pixel unit Pn+1_m of the (n+1)th row of pixel units (even row of pixel units), the first ends of the first pixel capacitor C21 and the second pixel capacitor C22 are both coupled to the common line CLn+1. The gates of the first switch T21 and the second switch T22 are both coupled to the gate line GLn+1. The first end of the first switch T21 is coupled to the second end of the first pixel capacitor C21. The first end of the second switch T22 is coupled to the second end of the second pixel capacitor C22. The second end of the first switch T21 is coupled to the data line DLm. The second end of the second switch T22 is coupled to the first end of the first switch T31 in the mth pixel unit Pn+2_m of the (n+2)th row of pixel units. The second end of the first switch T31 is coupled to the data line DLm. That is, both the second ends of the first switch T21 and the first switch T31 are coupled to the data line DLm, and both the first pixel capacitor C21 and the second pixel capacitor C22 are charged by the data signal SDm furnished via the data line DLm.

Accordingly, each first pixel capacitor 445 is charged via one corresponding data line 420 and the first switch 441 of the same pixel unit 440. Each second pixel capacitor 447 is charged via one corresponding data line 420, the first switch 441 of one different pixel unit 440, and the second switch 442 of the same pixel unit 440. For instance, the first pixel capacitor C11 of the pixel unit Pn_m is charged by the data signal SDm furnished via the data line DLm and the first switch T11 of the pixel unit Pn_m. The second pixel capacitor C12 of the pixel unit Pn_m is charged by the data signal SDm furnished via the data line DLm, the first switch T21 of the pixel unit Pn+1_m, and the second switch T12 of the pixel unit Pn_m.

The voltage generator 460 comprises a first output end for outputting the first common voltage Vcom1 and a second output end for outputting the second common voltage Vcom2. The odd and even common lines 430 are coupled to the first and second output ends of the voltage generator 460 for receiving the first common voltage Vcom1 and the second common voltage Vcom2 respectively. For instance, the odd common lines CLn and CLn+2 are coupled to the first output end of the voltage generator 460 for receiving the first common voltage Vcom1, and the even common lines CLn+1 and CLn+3 are coupled to the second output end of the voltage generator 460 for receiving the second common voltage Vcom2.

Figure 2:
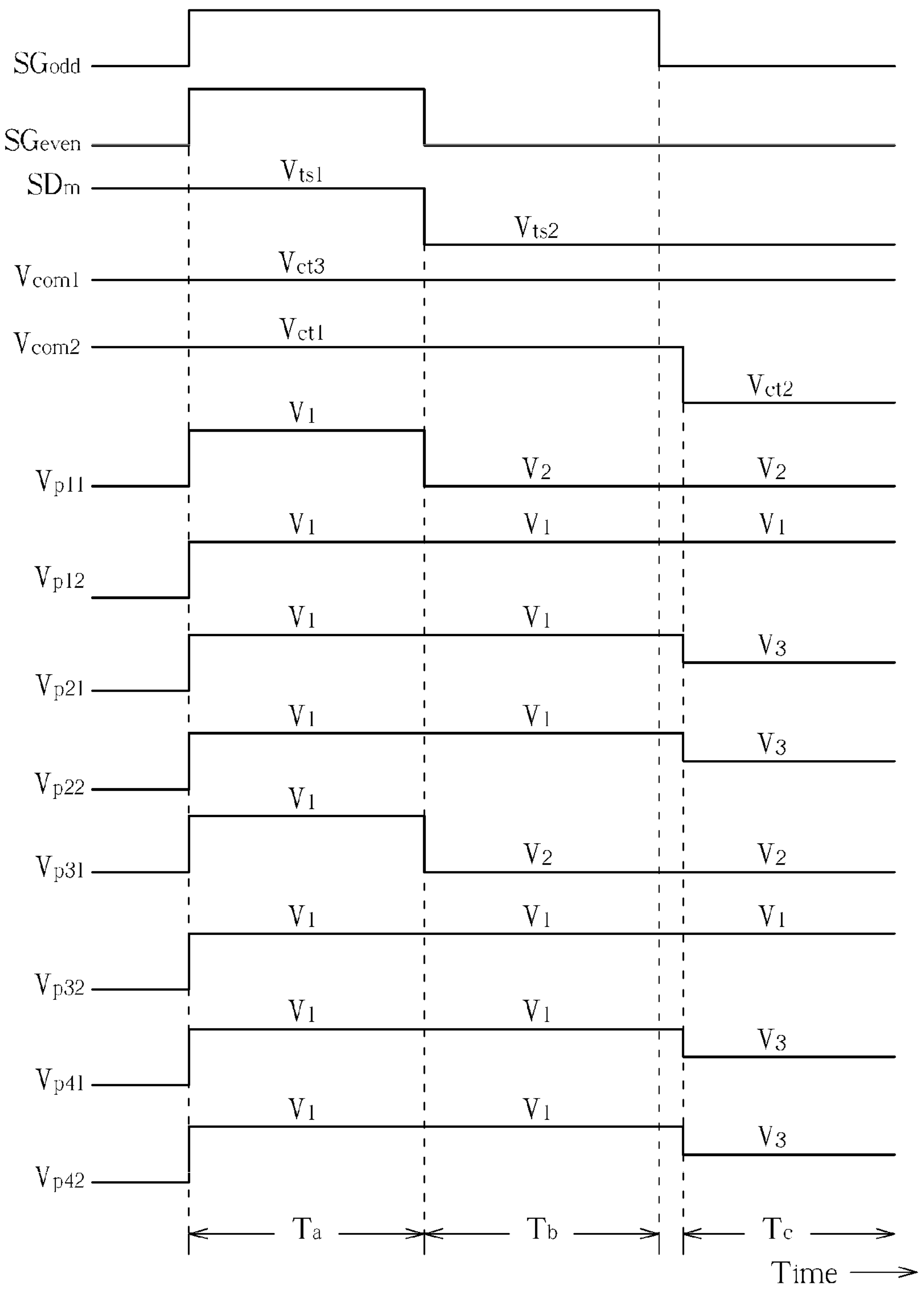
FIG. 2 shows the related signal waveforms for performing a first test method of the present invention on the LCD device in FIG. 1, having time along the abscissa.

FIG. 2 shows the related signal waveforms for performing a first test method of the present invention on the LCD device in FIG. 1, having time along the abscissa. While performing the short-circuit defect detection operation on the LCD device 400 in accordance with the first test method, the odd and even gate lines 410 are furnished with an odd gate signal SGodd and an even gate signal SGeven respectively, and the odd and even common lines 430 are furnished with the first common voltage Vcom1 and the second common voltage Vcom2 respectively. The signal waveforms in FIG. 2, from top to bottom, are the odd gate signal SGodd, the even gate signal SGeven, the data signal SDm, the first common voltage Vcom1, the second common voltage Vcom2, and the sub-pixel voltages $V_{P11}$-$V_{P42}$ corresponding to the four pixel units Pn_m-Pn+3-m. The first common voltage Vcom1 is set to be a constant voltage Vct3.

Figure 3:
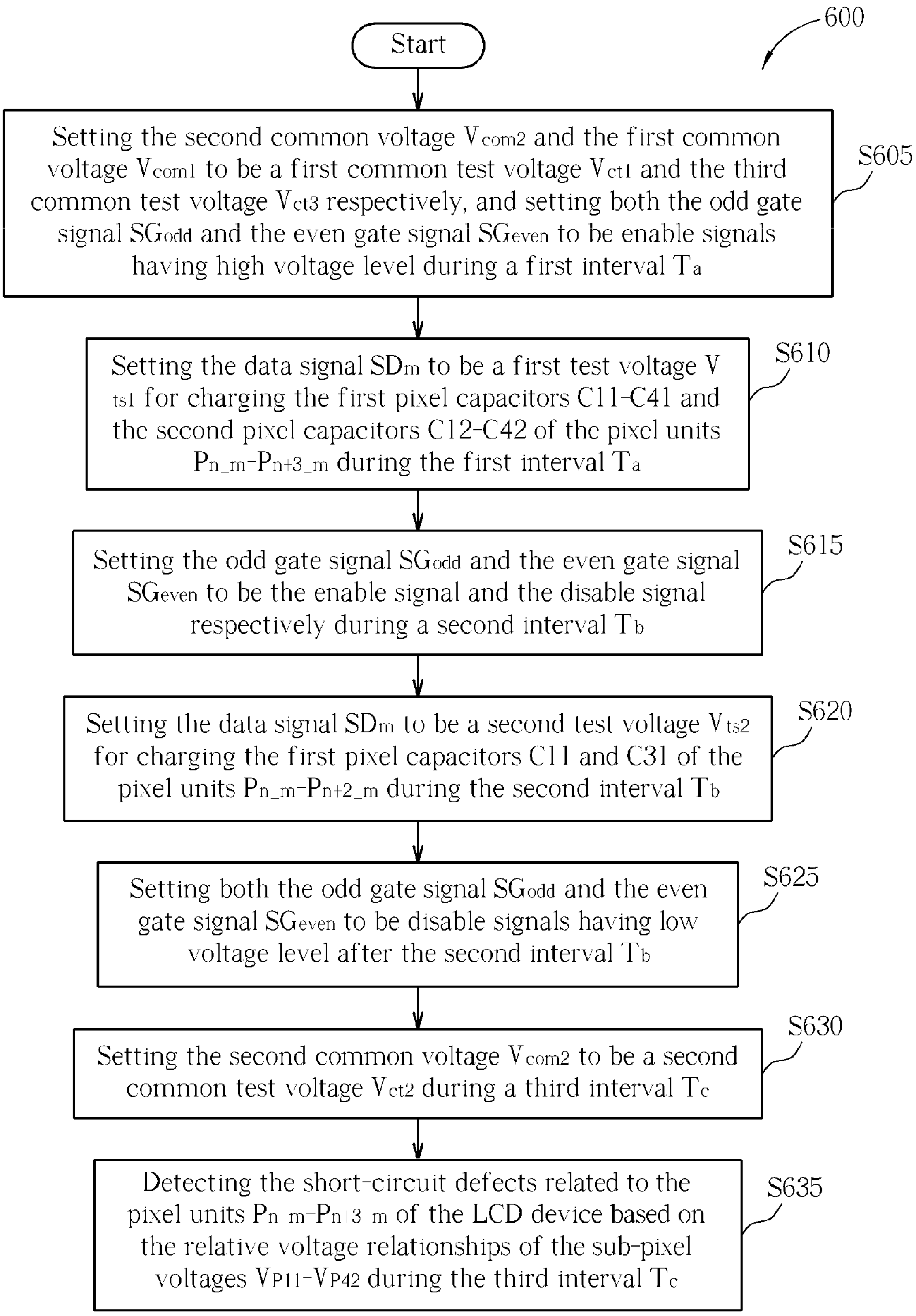
FIG. 3 is a flowchart depicting the first test method for performing the short-circuit defect detection operation on the LCD device in FIG. 1 based on the related signal waveforms in FIG. 2.

Referring to FIG. 3 in conjunction with FIGS. 1 and 2, FIG. 3 is a flowchart depicting the first test method for performing the short-circuit defect detection operation on the LCD device in FIG. 1 based on the related signal waveforms in FIG. 2. As shown in FIG. 3, the first test method 600 comprises the following steps:

Step S605: setting the second common voltage Vcom2 and the first common voltage Vcom1 to be a first common test voltage Vct1 and the third common test voltage Vct3 respectively, and setting both the odd gate signal SGodd and the even gate signal SGeven to be enable signals having high voltage level for turning on the first switches T11-T41 and the second switches T12-T42 during a first interval Ta;

Step S610: setting the data signal SDm to be a first test voltage Vts1 for charging the first pixel capacitors C11-C41 and the second pixel capacitors C12-C42 of the pixel units Pn_m-Pn+3_m for pulling up the sub-pixel voltages $V_{P11}$-$V_{P42}$ to the voltage V1 during the first interval Ta;

Step S615: setting the odd gate signal SGodd and the even gate signal SGeven to be the enable signal and the disable signal respectively for turning off the first switches T21, T41 and the second switches T22, T42 and continuously turning on the first switches T11, T31 and the second switches T12, T32 during a second interval Tb;

Step S620: setting the data signal SDm to be a second test voltage Vts2 for charging the first pixel capacitors C11 and C31 of the pixel units Pn_m and Pn+2_m for changing the sub-pixel voltages $V_{P11}$ and $V_{P31}$ from the voltage V1 to the voltage V2 during the second interval Tb;

Step S625: setting both the odd gate signal SGodd and the even gate signal SGeven to be disable signals having low voltage level for turning off the first switches T11, T31 and the second switches T12, T32 and continuously turning off the first switches T21, T41 and the second switches T22, T42 after the second interval Tb;

Step S630: setting the second common voltage Vcom2 to be a second common test voltage Vct2 for changing the sub-pixel voltages $V_{P21}$, $V_{P22}$, $V_{P41}$ and $V_{P42}$ from the voltage V1 to the voltage V3 during a third interval Tc; and Step S635: detecting the short-circuit defects related to the pixel units Pn_m-Pn+3_m of the LCD device 400 based on the relative voltage relationships of the sub-pixel voltages $V_{P11}$-$V_{P42}$ during the third interval Tc.

In the aforementioned flow of the first test method 600, the first interval Ta, the second interval Tb and the third interval Tc are not overlapped between each other, the first test voltage Vts1 is different from the second test voltage Vts2, and the first common test voltage Vct1 is also different from the second common test voltage Vct2. The process of step S630 is utilized for changing the sub-pixel voltages $V_{P21}$, $V_{P22}$, $V_{P41}$ and $V_{P42}$ from the voltage V1 to the voltage V3 based on the capacitive effect of the first pixel capacitors C21, C41 and the second pixel capacitors C22, C42 when the second common voltage Vcom2 is switching from the first common test voltage Vct1 to the second common test voltage Vct2. In another embodiment, the process of step S630 may further comprise setting the first common voltage Vcom1 to be another common test voltage different from the third common test voltage Vct3 for changing the sub-pixel voltages $V_{P11}$, $V_{P12}$, $V_{P31}$ and $V_{P32}$.

FIG. 4 is a table schematically showing the sub-pixel voltages of the flawless LCD device in FIG. 1 after performing the first test method based on the related signal waveforms in FIG. 2. As shown in FIG. 4, the sub-pixel voltages $V_{P21}$, $V_{P22}$ corresponding to the adjacent sub-pixel units of the pixel unit Pn+1_m are the same, the sub-pixel voltages $V_{P41}$, $V_{P42}$ corresponding to the adjacent sub-pixel units of the pixel unit Pn+3_m are also the same, and the sub-pixel voltages corresponding to the other adjacent sub-pixel units are different. That is, in the first test method 600 for performing the short-circuit defect detection operation regarding the four pixel units Pn_m-Pn+3_m, only the short-circuit defects of the adjacent sub-pixel units within the pixel units Pn+1_m and Pn+3_m cannot be detected, and the short-circuit defects corresponding to the other adjacent sub-pixel units can be detected.

Figure 5:
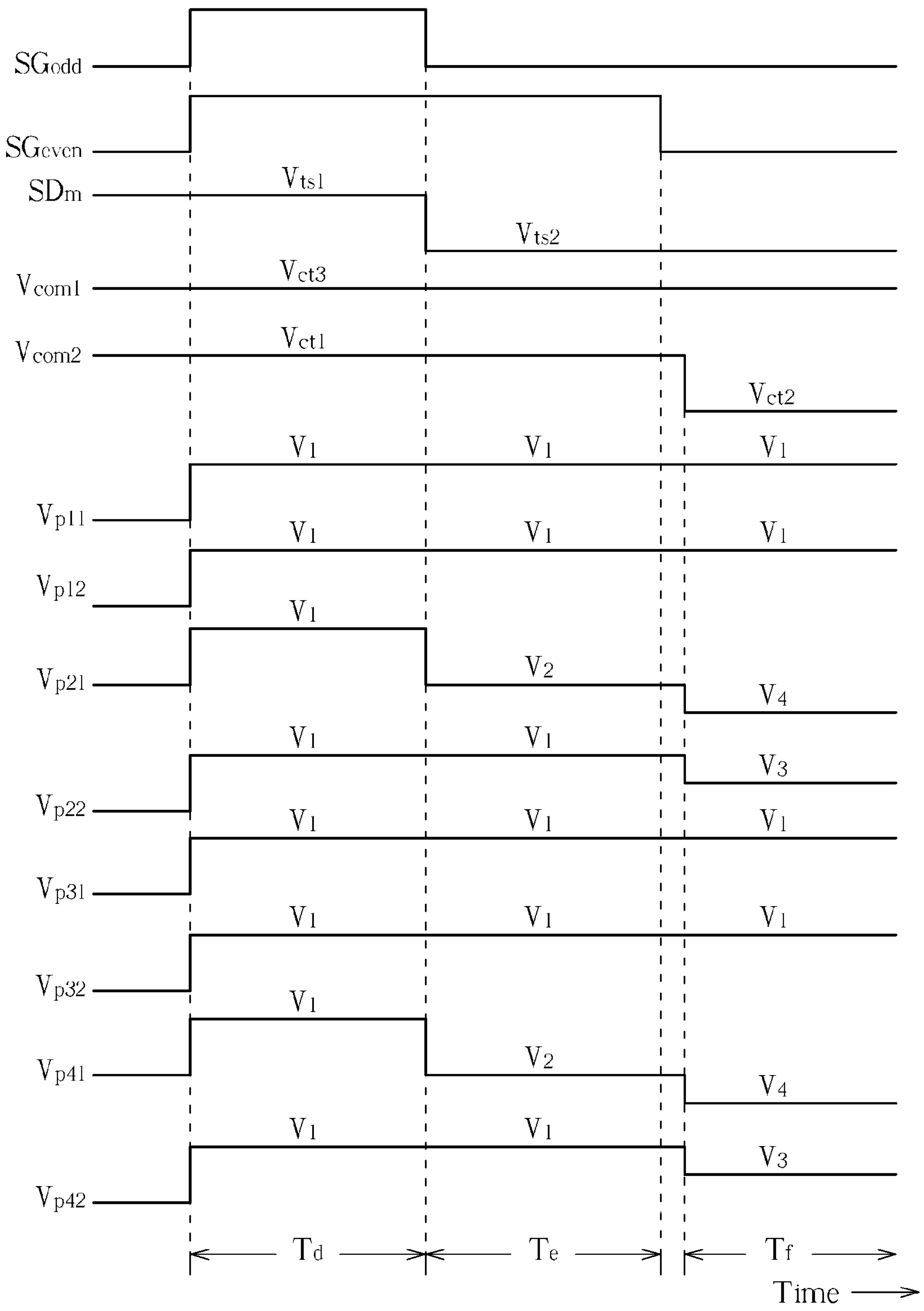
FIG. 5 shows the related signal waveforms for performing a second test method of the present invention on the LCD device in FIG. 1, having time along the abscissa.

FIG. 5 shows the related signal waveforms for performing a second test method of the present invention on the LCD device in FIG. 1, having time along the abscissa. The signal waveforms in FIG. 5, from top to bottom, are the odd gate signal SGodd, the even gate signal SGeven, the data signal SDm, the first common voltage Vcom1, the second common voltage Vcom2, and the sub-pixel voltages $V_{P11}$-$V_{P42}$ corresponding to the four pixel units Pn_m-Pn+3_m. The first common voltage Vcom1 is set to be a constant voltage Vct3.

Figure 6:
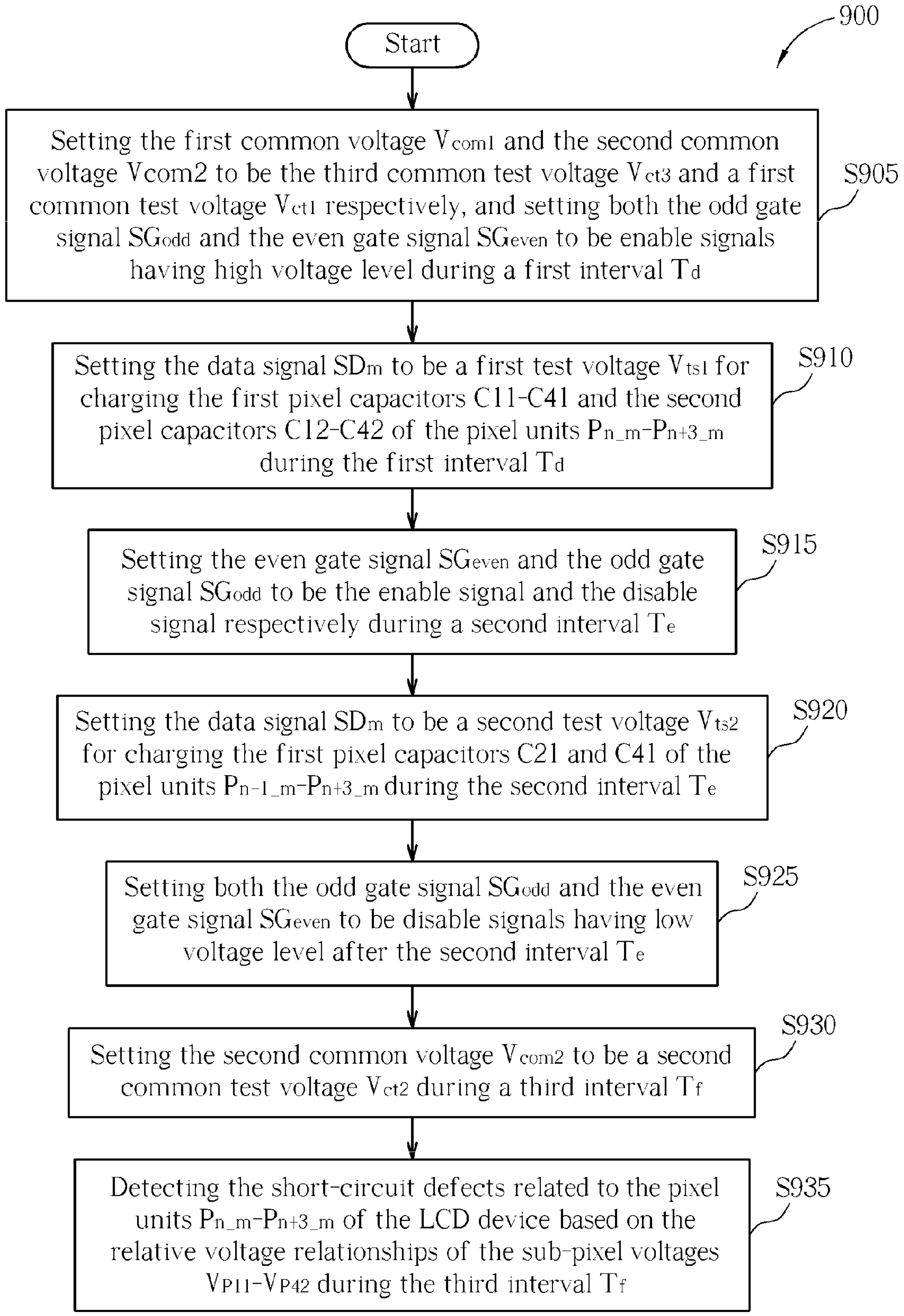
FIG. 6 is a flowchart depicting the second test method for performing the short-circuit defect detection operation on the LCD device in FIG. 1 based on the related signal waveforms in FIG. 5.

Referring to FIG. 6 in conjunction with FIGS. 1 and 5, FIG. 6 is a flowchart depicting the second test method for performing the short-circuit defect detection operation on the LCD device in FIG. 1 based on the related signal waveforms in FIG. 5. As shown in FIG. 6, the second test method 900 comprises the following steps:

Step S905: setting the first common voltage Vcom1 and the second common voltage Vcom2 to be the third common test voltage Vct3 and a first common test voltage Vct1 respectively, and setting both the odd gate signal SGodd and the even gate signal SGeven to be enable signals having high voltage level for turning on the first switches T11-T41 and the second switches T12-T42 during a first interval Td;

Step S910: setting the data signal SDm to be a first test voltage Vts1 for charging the first pixel capacitors C11-C41 and the second pixel capacitors C12-C42 of the pixel units Pn_m-Pn+3_m for pulling up the sub-pixel voltages $V_{P11}$-$V_{P42}$ to the voltage V1 during the first interval Td;

Step S915: setting the even gate signal SGeven and the odd gate signal SGodd to be the enable signal and the disable signal respectively for turning off the first switches T11, T31 and the second switches T12, T32 and continuously turning on the first switches T21, T41 and the second switches T22, T42 during a second interval Te;

Step S920: setting the data signal SDm to be a second test voltage Vts2 for charging the first pixel capacitors C21 and C41 of the pixel units Pn+1_m and Pn+3_m for changing the sub-pixel voltages $V_{P21}$ and $V_{P41}$ from the voltage V1 to the voltage V2 during the second interval Te;

Step S925: setting both the odd gate signal SGodd and the even gate signal SGeven to be disable signals having low voltage level for turning off the first switches T21, T41 and the second switches T22, T42 and continuously turning off the first switches T1, T31 and the second switches T12, T32 after the second interval Te;

Step S930: setting the second common voltage Vcom2 to be a second common test voltage Vct2 for changing the sub-pixel voltages $V_{P22}$ and $V_{P42}$ from the voltage V1 to the voltage V3 and changing the sub-pixel voltages $V_{P21}$ and $V_{P41}$ from the voltage V2 to the voltage V4 during a third interval Tf; and Step S935: detecting the short-circuit defects related to the pixel units Pn_m-Pn+3_m of the LCD device 400 based on the relative voltage relationships of the sub-pixel voltages $V_{P11}$-$V_{P42}$ during the third interval Tf.

In the aforementioned flow of the second test method 900, the first interval Td, the second interval Te and the third interval Tf are not overlapped between each other, the first test voltage Vts1 is different from the second test voltage Vts2, and the first common test voltage Vct1 is also different from the second common test voltage Vct2. The process of step S930 is utilized for changing the sub-pixel voltages $V_{P22}$ and $V_{P42}$ from the voltage V1 to the voltage V3 and changing the sub-pixel voltages $V_{P21}$ and $V_{P41}$ from the voltage V2 to the voltage V4 based on the capacitive effect of the first pixel capacitors C21, C41 and the second pixel capacitors C22, C42 when the second common voltage Vcom2 is switching from the first common test voltage Vct1 to the second common test voltage Vct2. In another embodiment, the process of step S930 may further comprise setting the first common voltage Vcom1 to be another common test voltage different from the third common test voltage Vct3 for changing the sub-pixel voltages $V_{P11}$, $V_{P12}$, $V_{P31}$ and $V_{P32}$.

FIG. 7 is a table schematically showing the sub-pixel voltages of the flawless LCD device in FIG. 1 after performing the second test method based on the related signal waveforms in FIG. 5. As shown in FIG. 7, the sub-pixel voltages $V_{P11}$, $V_{P12}$ corresponding to the adjacent sub-pixel units of the pixel unit Pn_m are the same, the sub-pixel voltages $V_{P31}$, $V_{P32}$ corresponding to the adjacent sub-pixel units of the pixel unit Pn+2_m are also the same, and the sub-pixel voltages corresponding to the other adjacent sub-pixel units are different. That is, in the second test method 900 for performing the short-circuit defect detection operation regarding the four pixel units Pn_m-Pn+3_m, only the short-circuit defects of the adjacent sub-pixel units within the pixel units Pn_m and Pn+2_m cannot be detected, and the short-circuit defects corresponding to the other adjacent sub-pixel units can be detected.

In view of the above discussion regarding the first test method 600 and the second test method 900, the short-circuit defects of the adjacent sub-pixel units within the pixel units Pn+1_m and Pn+3_m can only be detected by the second test method 900, the short-circuit defects of the adjacent sub-pixel units within the pixel units Pn_m and Pn+2_m can only be detected by the first test method 600, and the short-circuit defects corresponding to the other adjacent sub-pixel units can be detected by both the first test method 600 and the second test method 900. Consequently, the short-circuit defect corresponding to any two adjacent sub-pixel units of the LCD device 400 can be detected by either the first test method 600 or the second test method 900. As a result, all the short-circuit defects of the LCD device 400 can be accurately detected by integrating the test results of the first test method 600 and the second test method 900.

Figure 8:
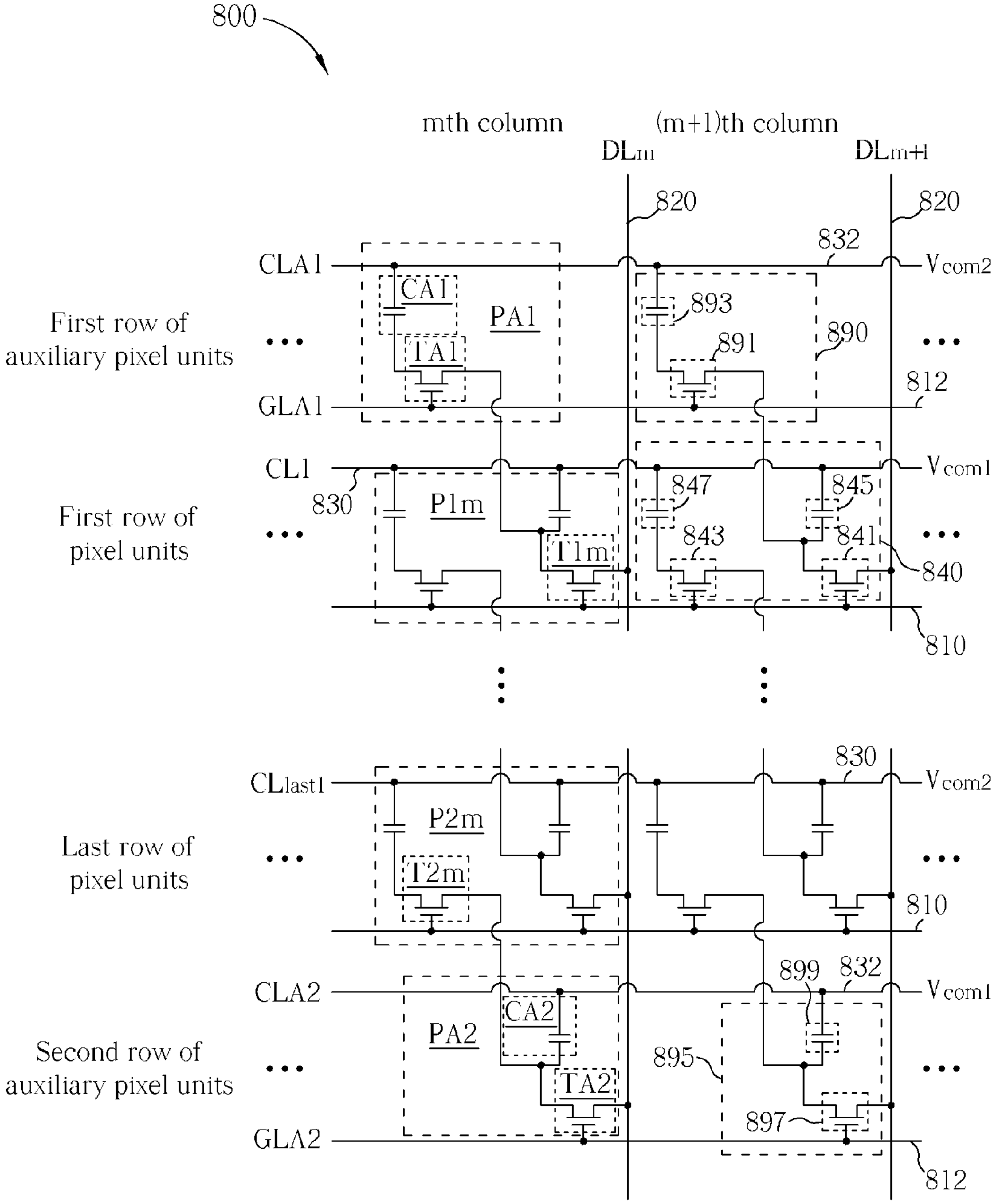
FIG. 8 is a schematic diagram showing an LCD device in accordance with a second embodiment of the present invention.

FIG. 8 is a schematic diagram showing an LCD device in accordance with a second embodiment of the present invention. As shown in FIG. 8, the LCD device 800 comprises a plurality of gate lines 810, a plurality of auxiliary gate lines 812, a plurality of data lines 820, a plurality of common lines 830, a plurality of auxiliary common lines 832, a plurality of rows of pixel units, and a plurality of rows of auxiliary pixel units. The plurality of rows of auxiliary pixel units comprise a first row of auxiliary pixel units and a second row of auxiliary pixel units. The first row of auxiliary pixel units is adjacent to the first row of pixel units, and the second row of auxiliary pixel units is adjacent to the last row of pixel units. The auxiliary gate lines 812 comprise a first auxiliary gate line GLA1 and a second auxiliary gate line GLA2. The auxiliary common lines 832 comprise a first auxiliary common line CLA1 and a second auxiliary common line CLA2. The first common line CL1 and the first auxiliary common line CLA1 are utilized for receiving the first common voltage Vcom1 and the second common voltage Vcom2 respectively. If the last common line CLlast1 is an even common line, then the last common line CLlast1 and the second auxiliary common line CLA2 are utilized for receiving the second common voltage Vcom2 and the first common voltage Vcom1 respectively as the embodiment shown in FIG. 8. In another embodiment, if the last common line CLlast1 is an odd common line, then the last common line CLlast1 and the second auxiliary common line CLA2 are utilized for receiving the first common voltage Vcom1 and the second common voltage Vcom2 respectively.

Each row of pixel units comprises a plurality of pixel units 840. Each pixel unit 840 comprises a first switch 841, a second switch 843, a first pixel capacitor 845, and a second pixel capacitor 847. The coupling relationships corresponding to the pixel units 840 disposed between the second and penultimate rows of pixel units are the same as the aforementioned coupling relationships of the LCD device 400 in FIG. 1, and for the sake of brevity, further similar description is omitted.

The first row of auxiliary pixel units comprises a plurality of top-margin auxiliary pixel units 890. The second row of auxiliary pixel units comprises a plurality of bottom-margin auxiliary pixel units 895. Each top-margin auxiliary pixel unit 890 comprises a first auxiliary switch 891 and a first auxiliary capacitor 893. Each bottom-margin auxiliary pixel unit 895 comprises a second auxiliary switch 897 and a second auxiliary capacitor 899. The first switch 841, the second switch 843, the first auxiliary switch 891 and the second auxiliary switch 897 can be MOS field effect transistors or thin film transistors.

Each first auxiliary capacitor 893 comprises a first end and a second end. The first end of each first auxiliary capacitor 893 is coupled to the first auxiliary common line CLA1. Each first auxiliary switch 891 comprises a first end coupled to the second end of one corresponding first auxiliary capacitor 893, a second end coupled to one corresponding first switch 841, and a gate coupled to the first auxiliary gate line GLA1. Each second auxiliary capacitor 899 comprises a first end and a second end. The first end of each second auxiliary capacitor 899 is coupled to the second auxiliary common line CLA2. Each second auxiliary switch 897 comprises a first end coupled to the second end of one corresponding second auxiliary capacitor 899, a second end coupled to one corresponding data line 820, and a gate coupled to the second auxiliary gate line GLA2. The first end of each second auxiliary switch 897 is further coupled to one corresponding second switch 843.

For instance, in the mth top-margin auxiliary pixel unit PA1 of the first row of auxiliary pixel units, the first end of the first auxiliary capacitor CA1 is coupled to the auxiliary common line CLA1. The first end of the first auxiliary switch TA1 is coupled to the second end of the first auxiliary capacitor CA1. The second end of the first auxiliary switch TA1 is coupled to the first switch T1*m* in the mth pixel unit P1*m* of the first row of pixel units. In the mth bottom-margin auxiliary pixel unit PA2 of the second row of auxiliary pixel units, the first end of the first auxiliary capacitor CA2 is coupled to the auxiliary common line CLA2. The first end of the first auxiliary switch TA2 is coupled to the second end of the first auxiliary capacitor CA2. The second end of the first auxiliary switch TA2 is coupled to the data line DLm. The first end of the first auxiliary switch TA2 is further coupled to the second switch T2*m* in the mth pixel unit P2*m* of the last row of pixel units.

With the aid of the first row of auxiliary pixel units, the writing operations for writing test voltages into the first pixel capacitors 845 of the first row of pixel units can be processed accurately. In other words, without the aid of the first row of auxiliary pixel units, the writing operations for writing test voltages into the first pixel capacitors 845 of the first row of pixel units cannot be processed accurately in that the charging processes for the first pixel capacitors 845 of the first row of pixel units are performed without the corresponding second pixel capacitors 847 or the equivalent first auxiliary capacitors 893. With the aid of the second row of auxiliary pixel units, the writing operations for writing test voltages into the second pixel capacitors 847 of the last row of pixel units can be processed accurately. Without the aid of the second row of auxiliary pixel units, the writing operations for writing test voltages into the second pixel capacitors 847 of the last row of pixel units cannot be processed.

In summary, all the short-circuit defects of the LCD device of the present invention can be detected by making use of the first and second test methods of the present invention. Accordingly, the driving circuit architecture of the LCD device of the present invention is fitting especially for implementing high-resolution LCD devices. That is, in the fabrication process of the LCD devices having high display resolution, the test architecture of the LCD devices can be utilized for performing an accurate defect detection operation so that the flawed semi-finished products can be thrown away in a real time for saving production cost. Furthermore, the cause of the defects can be analyzed completely so as to provide sufficient information regarding systematic problems with the fabrication process for improving the health of the fabrication process to achieve high yields.

Moreover, in an equivalent embodiment of the present invention, the voltage generator of the LCD device may further provide at least one extra common voltage different from the first and second common voltages. The different common voltages are furnished to different common lines for performing an accurate short-circuit defect detection operation on the LCD device according to the switching of test voltage levels of data signals in conjunction with the enable/disable switching of corresponding gate signals.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A liquid crystal display device comprising:

a plurality of data lines, each of the data lines being adapted to receive a corresponding data signal;

a plurality of gate lines, each of the gate lines being adapted to receive a corresponding gate signal;

a plurality of common lines, a plurality of odd common lines of the common lines being coupled to a first common voltage source, a plurality of even common lines of the common lines being coupled to a second common voltage source, the first common voltage source generating a first common voltage having only one voltage level during a defect detection cycle, the second common voltage source generating a second common voltage having different voltage levels during the defect detection cycle; and a plurality of rows of pixel units, each row of pixel units comprising a plurality of pixel units, wherein a plurality of pixel units of an odd row of pixel units in the rows of pixel units are coupled to a corresponding odd common line of the odd common lines, and a plurality of pixel units of an even row of pixel units in the rows of pixel units are coupled to a corresponding even common line of the even common lines.

2. The liquid crystal display device of claim 1, wherein each pixel unit comprises:

a first pixel capacitor comprising a first end coupled to a corresponding common line of the common lines, and a second end;

a second pixel capacitor comprising a first end coupled to the corresponding common line, and a second end;

a first switch comprising a first end coupled to the second end of the first pixel capacitor, a gate coupled to a corresponding gate line of the gate lines, and a second end coupled to a corresponding data line of the data lines; and a second switch comprising a first end coupled to the second end of the second pixel capacitor, a gate coupled to the corresponding gate line, and a second end coupled to the first end of a corresponding first switch, wherein the second end of the corresponding first switch is coupled to the corresponding data line.

3. The liquid crystal display device of claim 2, wherein:

the second end of the first switch of an mth pixel unit of an nth row of pixel units in the rows of pixel units is coupled to an mth data line of the data lines, wherein m and n are integers greater than zero;

the second end of the first switch of an mth pixel unit of an (n+1)th row of pixel units in the rows of pixel units is coupled to the mth data line of the data lines; and the second end of the second switch of the mth pixel unit in the nth row of pixel units is coupled to the first end of the first switch of the mth pixel unit in the (n+1)th row of pixel units.

4. The liquid crystal display device of claim 3, wherein:

the second end of the first switch of an (m+1)th pixel unit in the nth row of pixel units is coupled to an (m+1)th data line of the data lines;

the second end of the first switch of an (m+1)th pixel unit in the (n+1)th row of pixel units is coupled to the (m+1)th data line of the data lines; and the second end of the second switch of the (m+1)th pixel unit in the nth row of pixel units is coupled to the first end of the first switch of the (m+1)th pixel unit in the (n+1)th row of pixel units.

5. The liquid crystal display device of claim 2, further comprising:

a voltage generator comprising the first common voltage source coupled to the odd common lines for providing the first common voltage, and the second common voltage source coupled to the even common lines for providing the second common voltage;

an auxiliary gate line adjacent to a first gate line of the gate lines, the auxiliary gate line being adapted to receive an auxiliary gate signal;

an auxiliary common line coupled to the second common voltage source of the voltage generator for receiving the second common voltage; and an auxiliary row of pixel units comprising a plurality of auxiliary pixel units, each of the auxiliary pixel units comprising:

an auxiliary capacitor comprising a first end coupled to the auxiliary common line, and a second end; and an auxiliary switch comprising a first end coupled to the second end of the auxiliary capacitor, a gate coupled to the auxiliary gate line, and a second end coupled to the first end of a corresponding first switch.

6. The liquid crystal display device of claim 5, wherein:

the second end of the auxiliary switch of an mth auxiliary pixel unit in the auxiliary row of pixel units is coupled to the first end of the first switch of an mth pixel unit of a first row of pixel units in the rows of pixel units.

7. The liquid crystal display device of claim 2, further comprising:

a voltage generator comprising the first common voltage source coupled to the odd common lines for providing the first common voltage, and the second common voltage source coupled to the even common lines for providing the second common voltage;

an auxiliary gate line adjacent to a last gate line of the gate lines, the auxiliary gate line being adapted to receive an auxiliary gate signal; and an auxiliary row of pixel units comprising a plurality of auxiliary pixel units, each of the auxiliary pixel units comprising:

an auxiliary switch comprising a first end coupled to the second end of a corresponding second switch, a gate coupled to the auxiliary gate line, and a second end coupled to a corresponding data line.

8. The liquid crystal display device of claim 7, wherein the auxiliary pixel unit further comprises:

an auxiliary capacitor comprising a first end for receiving the first common voltage or the second common voltage, and a second end coupled to the first end of the auxiliary switch.

9. The liquid crystal display device of claim 8, further comprising:

an auxiliary common line coupled to the first end of the auxiliary capacitor.

10. The liquid crystal display device of claim 9, wherein the auxiliary common line is further coupled to the first common voltage source or the second common voltage source of the voltage generator.

11. The liquid crystal display device of claim 7, wherein:

the first end of the auxiliary switch of an mth auxiliary pixel unit in the auxiliary row of pixel units is coupled to the second end of the second switch of an mth pixel unit of a last row of pixel units in the rows of pixel units.

12. The liquid crystal display device of claim 1, further comprising:

a source driver coupled to the data lines for providing the data signals; and a gate driver coupled to the gate lines for providing the gate signals.

13. A test method for testing an LCD device, the LCD device comprising a plurality of first gate lines, a plurality of second gate lines, a plurality of data lines, a plurality of first common lines and a plurality of second common lines, the test method comprising:

furnishing a gate enable signal to the first gate lines and the second gate lines, furnishing a first test voltage to a data line of the data lines, furnishing a first common test voltage to the first common lines, furnishing a second common test voltage to the second common lines during a first interval;

furnishing the gate enable signal to the first gate lines, furnishing a gate disable signal to the second gate lines, furnishing a second test voltage to the data line, furnishing the first common test voltage to the first common lines, furnishing the second common test voltage to the second common lines during a second interval; and furnishing the gate disable signal to the first gate lines and the second gate lines, furnishing a third common test voltage to the second common lines during a third interval.

14. The test method of claim 13, wherein the first gate lines are a plurality of odd gate lines, the second gate lines are a plurality of even gate lines, the first common lines are a plurality of odd common lines, and the second common lines are a plurality of even common lines.

15. The test method of claim 13, wherein the first gate lines are a plurality of odd gate lines, the second gate lines are a plurality of even gate lines, the first common lines are a plurality of even common lines, and the second common lines are a plurality of odd common lines.

16. The test method of claim 13, wherein the first gate lines are a plurality of even gate lines, the second gate lines are a plurality of odd gate lines, the first common lines are a plurality of even common lines, and the second common lines are a plurality of odd common lines.

17. The test method of claim 13, wherein the first gate lines are a plurality of even gate lines, the second gate lines are a plurality of odd gate lines, the first common lines are a plurality of odd common lines, and the second common lines are a plurality of even common lines.

18. The test method of claim 13, wherein the first interval, the second interval and the third interval are not overlapped between each other.

19. The test method of claim 13, wherein the first interval is prior to the second interval and the second interval is prior to the third interval.

20. A liquid crystal display device comprising:

a plurality of data lines, each of the data lines being adapted to receive a corresponding data signal;

a plurality of gate lines, each of the gate lines being adapted to receive a corresponding gate signal;

a plurality of common lines, a plurality of odd common lines of the common lines being adapted for receiving a first common voltage, a plurality of even common lines of the common lines being adapted for receiving a second common voltage; and a plurality of rows of pixel units, each row of pixel units comprising a plurality of pixel units, wherein a plurality of pixel units of an odd row of pixel units in the rows of pixel units are coupled to a corresponding odd common line of the odd common lines, and a plurality of pixel units of an even row of pixel units in the rows of pixel units are coupled to a corresponding even common line of the even common lines, and wherein each pixel unit comprises:

a first pixel capacitor comprising a first end coupled to a corresponding common line of the common lines, and a second end;

a second pixel capacitor comprising a first end coupled to the corresponding common line, and a second end;

a first switch comprising a first end coupled to the second end of the first pixel capacitor, a gate coupled to a corresponding gate line of the gate lines, and a second end coupled to a corresponding data line of the data lines; and a second switch comprising a first end coupled to the second end of the second pixel capacitor, a gate coupled to the corresponding gate line, and a second end coupled to the first end of a corresponding first switch, wherein the second end of the corresponding first switch is coupled to the corresponding data line.

* * * * *